(12) United States Patent
Kojima et al.

(10) Patent No.: US 7,518,286 B2
(45) Date of Patent: Apr. 14, 2009

(54) VIBRATION WAVE DRIVEN APPARATUS AND VIBRATOR

(75) Inventors: Nobuyuki Kojima, Machida (JP);
 Satoru Kitajima, Kawasaki (JP)

(73) Assignee: Canon Kabushiki Kaisha (JP)

( * ) Notice: Subject to any disclaimer, the term of this patent is extended or adjusted under 35 U.S.C. 154(b) by 202 days.

(21) Appl. No.: 10/576,812

(22) PCT Filed: Jun. 9, 2005

(86) PCT No.: PCT/JP2005/010989

§ 371 (c)(1),
(2), (4) Date: Apr. 24, 2006

(87) PCT Pub. No.: WO2005/122381

PCT Pub. Date: Dec. 22, 2005

(65) Prior Publication Data
US 2007/0069609 A1    Mar. 29, 2007

(30) Foreign Application Priority Data
Jun. 9, 2004  (JP) .............................. 2004-171641

(51) Int. Cl.
 *H01L 41/04* (2006.01)
 *H01L 41/09* (2006.01)
(52) U.S. Cl. .................. 310/323.01; 310/328
(58) Field of Classification Search ................
 310/323.01–323.06, 323.16, 323.17, 328,
 310/330–332
 See application file for complete search history.

(56) References Cited

U.S. PATENT DOCUMENTS 5,672,930 A * 9/1997 Narisawa et al. ....... 310/323.03

2005/0104476 A1 * 5/2005 Maruyama et al. .......... 310/328

FOREIGN PATENT DOCUMENTS

| EP | 0 691 692 A1 | 1/1996 |
|----|---|---|
| JP | 6-24395 U | 3/1994 |
| JP | 6-165539 A | 6/1994 |
| JP | 6-106028 B2 | 12/1994 |

(Continued)

OTHER PUBLICATIONS

Relevant portion of International Search Report of corresponding PCT Application PCT/JP2005/010989.

(Continued)

*Primary Examiner*—Karl Tamai
*Assistant Examiner*—Derek J Rosenau
(74) *Attorney, Agent, or Firm*—Rossi, Kimms & McDowell LLP

(57) ABSTRACT

A vibration wave driven apparatus which makes it possible to secure a required component accuracy obtained by machining and can increase a power ratio to the size of the apparatus. A plurality of contact parts are formed on one surface of an elastic vibration plate of a vibrator, and are disposed in contact with a friction member of a slider. A piezoelectric element plate is joined to the other surface of the vibration plate. Thinner parts as recessed parts are formed in the vibration plate at locations other than the contact parts, whereby the vibration plate is disposed in contact with the friction member of the slider at the contact parts.

15 Claims, 7 Drawing Sheets

FOREIGN PATENT DOCUMENTS

| | | |
|---|---|---|
| JP | 11-098866 A | 4/1999 |
| JP | 11-252959 A | 9/1999 |
| JP | 2001-111128 A | 4/2001 |
| JP | 2001-258279 A | 9/2001 |

OTHER PUBLICATIONS

Relevant portion of International Search Report of corresponding PCT Application PCT/JP2005/010989, Oct. 4, 2005.

* cited by examiner

VIBRATION WAVE DRIVEN APPARATUS AND VIBRATOR

TECHNICAL FIELD

The present invention relates to a vibration wave driven apparatus and a vibrator. In particular, the present invention relates to the shape of a vibrator of a small linear type ultrasonic motor.

BACKGROUND ART

An ultrasonic motor disclosed in Japanese Patent Publication (Kokoku) No. H06-106028 uses a bar-like or plate-like vibrator having projections. An ultrasonic motor disclosed in Japanese Laid-Open Patent Publication (Kokai) No. 2001-111128 has a vibrator that has contact parts instead of projections.

The ultrasonic motor disclosed in Japanese Patent Publication (Kokoku) No. H06-106028 includes, as shown in FIG. 12, a vibration plate 51 which has one surface thereof formed with projections 52a and 52b, piezoelectric elements 53a, 53b, and 53c provided on the other surface of the vibration plate 51; and a driven member 55 disposed in contact with the projections 52a and 52b. The piezoelectric elements 53a, 53b, and 53c excite the vibration plate 51 to generate vibrations in a stretching vibration mode and a bending vibration mode. The projections 52a and 52b are disposed at the loops of vibrations in the stretching vibration mode or in the vicinity thereof so that the tip ends thereof make a reciprocating motion in a direction indicated by "X" in FIG. 12. The projections 52a and 52b are also disposed in the vicinity of the loops of vibrations in the bending vibration mode so that the tip ends thereof make a reciprocating motion in a direction indicated by "Z" in FIG. 12. Vibrations in the stretching vibration mode and vibrations in the bending vibration mode are combined to cause the tip ends of the projections 52a and 52b to make an elliptic motion. This elliptic motion causes a feeding force to be transmitted to the driven member 55 to move the driven member 55 relative to the vibration plate 51 in the direction indicated by "X" in FIG. 12.

The reason why the vibration plate 51 has the projections 52a and 52b that are disposed at loops of vibrations in the stretching vibration mode or in the vicinity thereof and are also disposed in the vicinity of loops of vibrations in the bending vibration mode is that contacting of the driven member 55 with the vibration plate 51 at a position other than these positions causes an inconvenience such as generation of abnormal noise or reduced output. An elliptic motion generated at a position other than these positions has magnitude and phase that are different from those of an elliptic motion that is generated at the loops of vibrations in the stretching vibration mode or in the vicinity thereof and in the vicinity of the loops of vibrations in the bending vibration mode. This even impedes movement of the driven member 55.

As shown in FIG. 13, the ultrasonic motor disclosed in Japanese Laid-Open Patent Publication (Kokai) No. 2001-111128 includes a frame-like base 60, a rectangular flat vibration plate 61 supported by the base 60 via four stays and having a substantially smooth surface without no projection or recessed portion, a piezoelectric element 63 provided on one surface of the vibration plate 61 at one end portion 62 thereof, and a driven member 65 disposed in contact with the other surface of the vibration plate 61.

The piezoelectric element 63 excites the vibration plate 61 to generate primary out-of-plane bending vibrations to cause the vibration plate 61 to be arcuately deformed. This deformation causes both ends of the vibration plate 61 to be displaced, thereby moving the driven member 65 relative to the vibration plate 61 in a direction indicated by the arrow in FIG. 13. This vibration plate 61 has no projection and thus is excellent in workability, thereby providing the advantage that the manufacturing process can be simplified and a required component accuracy can be easily obtained.

However, in the case of the ultrasonic motor disclosed in Japanese Laid-Open Patent Publication (Kokai) No. 2001-111128, the vibration plate 61 of the vibrator has only the out-of-plane bending vibration mode as a vibration mode in which it can be excited to generate vibrations, making it difficult to obtain a large force for feeding the driven member. Further, in the ultrasonic motor disclosed in Japanese Laid-Open Patent Publication (Kokai) No. 2001-111128, the contact parts at which the vibration plate 61 contacts the driven member 61 are edges of the vibration plate 61, which have a very small area. Thus, it is difficult to form the contact parts at which the vibration plate of the vibrator contacts the driven member so as to obtain a desired shape and a desired flatness with a high accuracy.

On the other hand, in the case of the ultrasonic motor disclosed in Japanese Patent Publication (Kokoku) No. H06-106028, the vibration plate 51 of the vibrator is excited in the two vibration modes, thus being free of the above-described problem, i.e. an insufficient output from an ultrasonic motor. Moreover, this ultrasonic motor also has the two projections 52a and 52b and thus does not suffer from the above-described problem of the shape and flatness of the contact parts. However, in the vibration plate 51, the projections 52a and 52b are generally prepared from a material by machining and this machining cuts off significant portions of the vibration plate 51 other than the projections. Thus, the vibration plate 51 tends to have a deformation due to machining. In addition, it is difficult to provide the machined portions with a required accuracy. Furthermore, the existence of the projections 52a and 52b increases the size of the vibrator, which is not suitable for designing the ultrasonic motor compact in size.

DISCLOSURE OF INVENTION

It is an object of the present invention to provide a vibration wave driven apparatus and a vibrator that make it possible to secure a required component accuracy obtained by machining and can increase a power ratio to the size of the apparatus.

To attain the above object, in a first aspect of the present invention, there is provided a vibration wave driven apparatus comprising a driven member, an elastic member having one surface opposed to the driven member, and another surface, the elastic member having a plurality of contact parts formed on the one surface and disposed in contact with the driven member, the elastic member being formed of a single member, and an electromechanical conversion element joined to the other surface of the elastic member, wherein at least one of the elastic member and the electromechanical conversion element has a portion thereof opposed to the driven member, the portion having at least one recessed part formed therein at a location other than the contact parts, whereby the elastic member is disposed in contact with the driven member at the contact parts.

Preferably, the elastic member has a second portion not opposed to the driven member, the second portion being flush with the contact parts.

Preferably, the elastic member is formed from a metal plate material by press punching or by an etching process.

Preferably, the electromechanical conversion element comprises a laminated piezoelectric element having piezoelectric materials and electrode materials alternately laminated one upon another.

Preferably, the elastic member includes a plurality of second recessed parts for adjusting vibration characteristics of the vibrator formed therein at a plurality of locations thereof.

Preferably, the elastic member has at least one supporting part integrally formed thereon, for supporting the vibrator.

Preferably, the electromechanical conversion element excites the elastic member in a plurality of out-of-plane bending vibration modes having different wavelength directions.

More preferably, the plurality of contact parts are formed in a vicinity of loops of one of the bending vibration modes and in a vicinity of nodes of another one of the bending vibration modes.

Preferably, the contact parts have at least one space formed in a surface thereof opposed to the electromechanical conversion element.

Preferably, the driven member and the elastic member form a magnetic circuit.

To attain the above object, in a second aspect of the present invention, there is provided a vibrator comprising an elastic member having one surface and another surface, the elastic member having a plurality of contact parts formed on the one surface, the elastic member being formed of a single member, and an electromechanical conversion element joined to the other surface of the elastic member, wherein the electromechanical conversion element excites the elastic member in a plurality of out-of-plane bending vibration modes having different wavelength directions, and the elastic member has a recessed part formed on the one surface thereof between the plurality of contact parts.

Preferably, the elastic member is formed from a metal plate material by press punching or by an etching process.

Preferably, the electromechanical conversion element comprises a laminated piezoelectric element having piezoelectric materials and electrode materials alternately laminated one upon another.

Preferably, the elastic member includes a plurality of second recessed parts for adjusting vibration characteristics of the vibrator formed therein at a plurality of locations thereof.

Preferably, the elastic member has at least one supporting part integrally formed thereon, for supporting the vibrator.

Preferably, the plurality of contact parts are formed in a vicinity of loops of one of the bending vibration modes and in a vicinity of nodes of another one of the bending vibration modes.

Preferably, the contact parts have at least one space formed in a surface thereof opposed to the electromechanical conversion element.

The above and other features and advantages of the present invention will be apparent from the following description taken in conjunction with the accompanying drawings, in which like reference characters designate the same name or similar parts throughout the figures thereof.

BEST MODE FOR CARRYING OUT THE INVENTION

The present invention will be described with reference to the drawings showing a preferred embodiment thereof.

Figure 1:
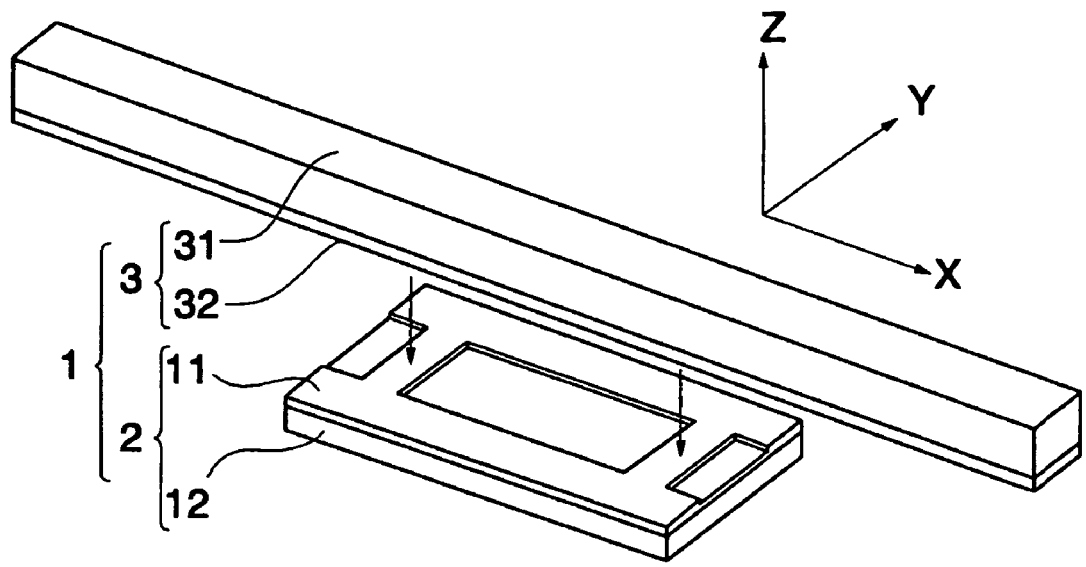
FIG. 1 is a schematic perspective view showing a vibration wave driven apparatus according to an embodiment of the present invention.

FIG. 1 is a schematic perspective view showing an ultrasonic motor as a vibration wave driven apparatus according to an embodiment of the present invention.

The ultrasonic motor 1 in FIG. 1 is mainly comprised of a vibrator 2, and a slider 3 held in contact with the vibrator 2 while being pressurized by the vibrator. In addition to these components, the ultrasonic motor 1 also includes a flexible substrate for electrically connecting the vibrator 2 to an external device, a supporting member that supports the vibrator 2, a guide member for the slider 3, and a pressurization mechanism for pressurizing the slider 3 against the vibrator 2. These components such as the flexible substrate and the supporting member are already known, and description thereof is omitted.

The slider 3 is comprised of a square bar-like slider base part 31 formed of a magnetic material, and a plate-like friction member 32 that is joined to the slider base part 31 and is formed of a material having a high friction coefficient and a high friction durability. In the present embodiment, a martensite-based material SUS440C with its surface subjected to nitriding is used as the material of the friction member 32.

The magnetic material constituting the slider base part 31 forms a magnetic circuit together with the ferromagnetic material SUS440C constituting the vibration plate 11. The friction member 32 generates a frictional force acting between the friction member 32 and the vibration plate 11 when the slider 3 is pressurized against the vibrator 2.

The vibrator 2 is comprised of a rectangular flat plate-like elastic vibration plate 11 having a part of one surface thereof formed as contact parts 11-$a$ (see FIG. 2) that are in contact with the friction member 32 of the slider 3, and a piezoelectric element plate 12 also having a rectangular flat plate-like shape and joined by bonding using an adhesive or the like to the other surface of the vibration plate 11, thus presenting a so-called unimorph structure. The vibration plate 11 is formed from a 0.15 mm-thick plate material SUS440C that is a ferromagnetic martensite-based stainless steel, by machining. The entire vibration plate 11 has a substantially flat plate-like shape and hence can exhibit desired in-plane rigidity. Thus, the vibrator 2 can satisfy in-plane rigidity of the vibration plate 11 that the unimorph structure is required to have.

Figure 2:
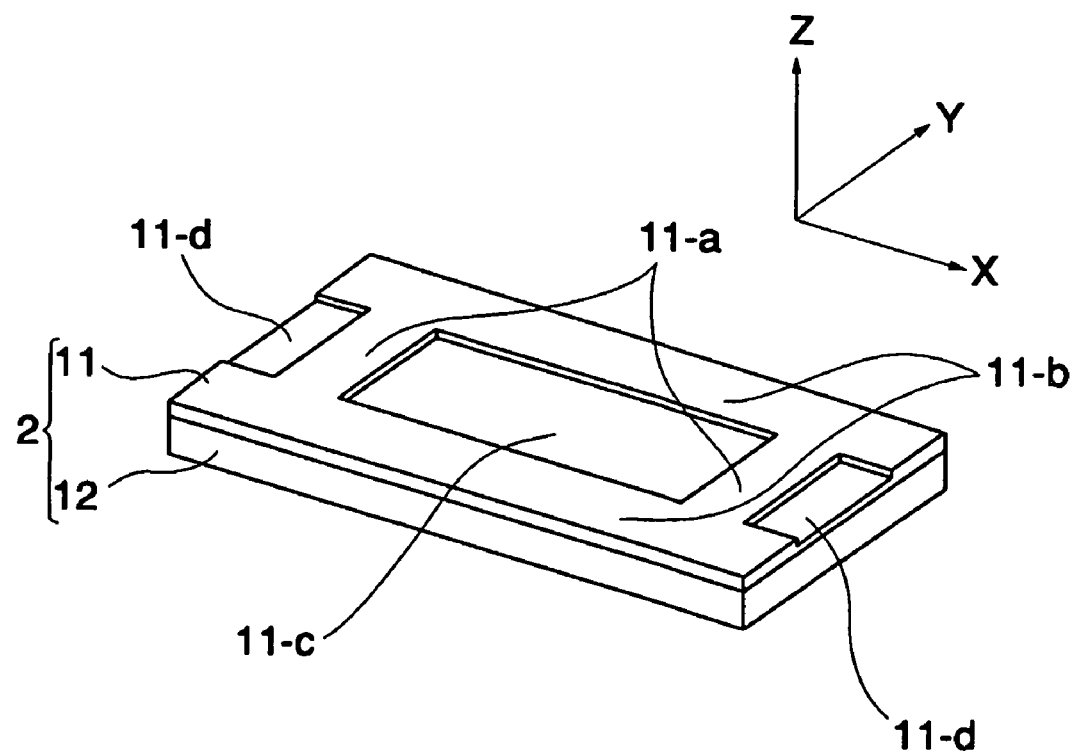
FIG. 2 is a perspective view showing a vibrator appearing in FIG. 1.

FIG. 2 is a perspective view showing the vibrator 2 in FIG. 1.

In the vibrator 2 of FIG. 2, the vibration plate 11 and the piezoelectric element plate 12 have shapes and relative positions thereof determined so that edges of the two members in the directions "X" and "Y" are substantially aligned with each other. The vibrator 2 has a longer side of 5.5 mm, a shorter side of 3.1 mm, and a thickness of 0.5 mm.

The vibration plate 11 has, on one surface thereof, two contact parts 11-*a* and two edge parts 11-*b* constituting thicker parts. The contact parts 11-*a* extend in the direction "Y" while the edge parts 11-*b* extend in the direction "X". The vibration plate 11 also includes, at a region opposed to the slider 3, a thinner part 11-*c* as a recessed part provided at the center of the vibration plate 11 in the direction "X" and two thinner parts 11-*d* as recessed parts provided at both ends of the vibration plate 11 in the direction "X". The surfaces of the contact parts 11-*a* are flush with the surfaces of the edge parts 11-*b*. The two edge parts 11-*b* are not opposed to the slider 3. The vibration plate 11 is formed integrally with a supporting member, not shown, for supporting the vibrator 2.

The two contact parts 11-*a* are disposed in the vicinity of the loops of a first vibration mode and in the vicinity of nodes of a second vibration mode (FIG. 4A and FIG. 4B), respectively. The vibration plate 11 is excited in the first vibration mode and the second vibration mode by the piezoelectric element plate 12.

The vibration plate 11 has portions on one surface thereof corresponding to the thinner parts 11-*c* and 11-*d* subjected to etching processing so as to have a reduced thickness, to thereby form the thinner parts 11-*c* and 11-*d*. The thinner parts 11-*c* and 11-*d* have a thickness of 0.1 mm.

The thinner parts 11-*c* and 11-*d* may be formed by notching using press punching. It should be noted that the above-mentioned size values of the vibration plate 11 and the piezoelectric element plate 12 are merely given by way of example and the sizes are not limited to the above-mentioned values. These size values of the vibrator 2 may be freely set depending on the required entire size of the vibrator 2 and the resonance frequencies of the vibration modes.

Figure 3:
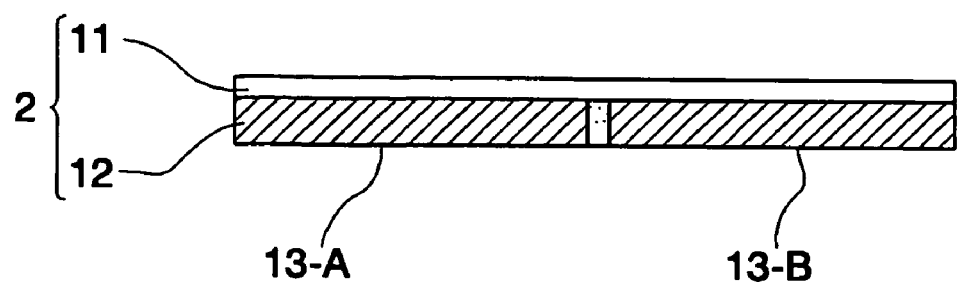
FIG. 3 is a cross-sectional view taken along plane X-Z in FIG. 2, showing the vibrator of FIG. 2.

FIG. 3 is a cross-sectional view taken along plane X-Z in FIG. 2, showing the vibrator 2 of FIG. 2.

The piezoelectric element plate 12 shown in FIG. 3 is formed by a laminated piezoelectric element in FIG. 5, which will be described later. Alternatively, the piezoelectric element 12 may be formed by a bulk piezoelectric element.

Figure 4A:
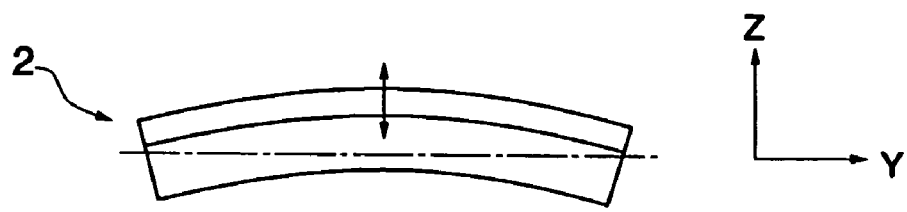
FIG. 4A is a diagram useful in explaining a first vibration mode in which the vibrator in FIG. 1 is excited.
Figure 4B:
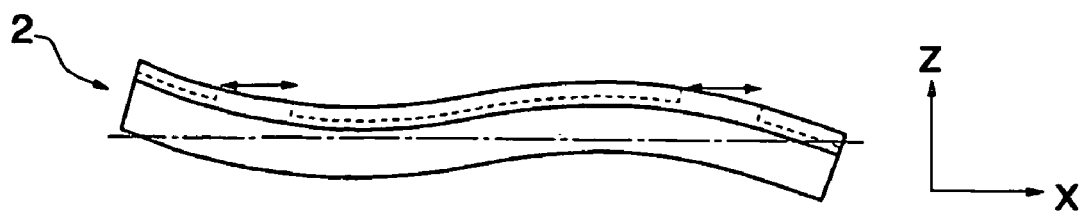
FIG. 4B is a diagram useful in explaining a second vibration mode in which the vibrator is excited.
Figure 5A:
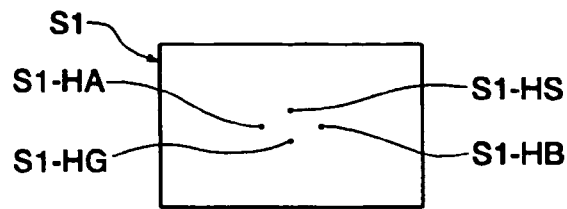
FIG. 5A to FIG. 5G are top plan views showing respective piezoelectric element films laminated on a piezoelectric element plate appearing in FIG. 2.
Figure 5B:
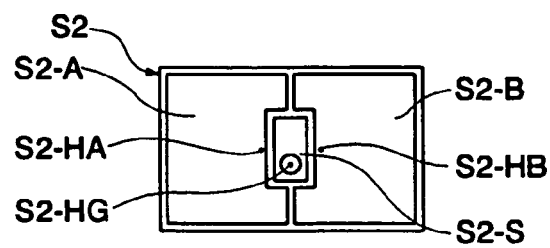
Figure 5C:
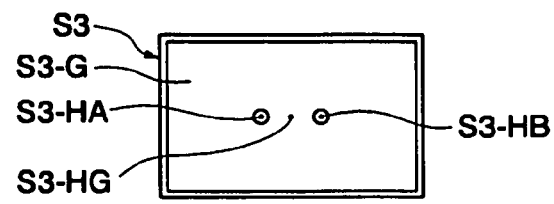
Figure 5D:
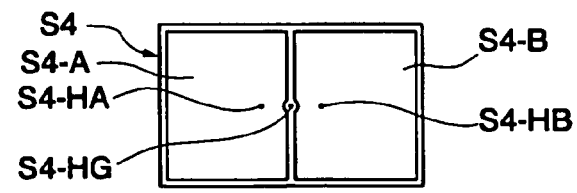
Figure 5E:
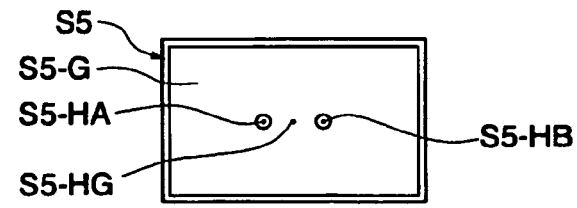
Figure 5F:
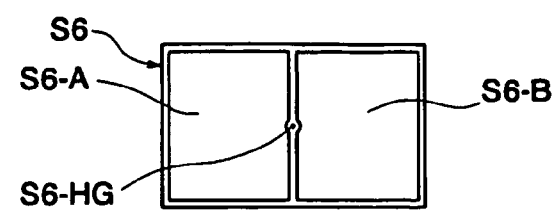
Figure 5G:
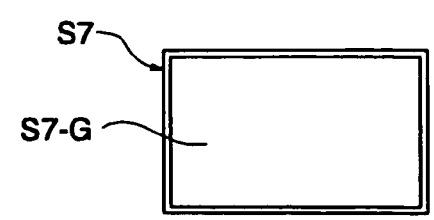

As shown in FIG. 3, the piezoelectric element plate 12 is comprised of two activation parts 13-A and 13-B arranged side by side in the direction "X". When a predetermined electric field is applied to each of these activation parts 13-A and 13-B, the vibrator 2 becomes deformed in a bent manner. The piezoelectric element plate 12, which, including parts 11-*b*, 11-*c*, and 11-*d* other than the contact parts 11-*a*, is fixedly joined to the vibration plate 11, is deformed in a bent manner together with the vibration plate 11. Specifically, when alternating current signals of a frequency close to the resonance frequencies of the vibration plate 11 in the first and second vibration modes described later with reference to FIG. 4A and FIG. 4B are applied to the respective activation parts 13-A and 13-B so that the phases of the alternating current signals are offset by 90° from each other, the vibrator 2 can be excited in the first and second vibration modes. Thus, the vibrations in the first vibration mode are substantially shifted by 90° from those in the second vibration mode.

FIG. 4A is a diagram useful in explaining the first vibration mode in which the vibrator 2 in FIG. 1 is excited, and FIG. 4B is a diagram useful in explaining the second vibration mode in which the vibrator 2 is excited. It should be noted that, for easy understanding of the first vibration mode and the second vibration mode, FIG. 4A and FIG. 4B show amounts of displacement of the vibrator 2 in an exaggerated manner.

In FIG. 4A, the first vibration mode is a primary out-of-plane bending mode in which two vibration nodes are generated as viewed in the direction "X" in FIG. 2. In FIG. 4B, the second vibration mode is a secondary out-of-plane bending mode in which three vibration nodes are generated as viewed in the shown direction "Y" in FIG. 2. The first vibration mode and the second vibration mode are different in wavelength direction, i.e. in the direction in which the nodes are generated. The shape of the vibrator 2 is selected so that these two vibration modes have substantially the same resonance frequency.

When the vibrator 2 is exited in the first vibration mode, the two contact parts 11-*a* repeatedly make up-and-down motions in the direction "Z" in FIG. 4. When the vibrator 2 is exited in the second vibration mode, the two contact parts 11-*a* repeatedly make forward and backward motions in the direction "X" in FIG. 4. When excitations in the first and second vibration modes are carried out such that the respective vibration modes are shifted in temporal phase by 90° for example, the plurality of contact parts 11-*a* make elliptic motions in the X-Z plane with different phases but with the same trajectory. These elliptic motions cause a feeding force to act upon the slider 3 disposed in pressure contact with the contact parts 11-*a*, in the direction "X" in FIG. 1 to move the slider 3 relative to the vibrator 2.

The thinner parts 11-*c* and 11-*d* are recessed or lower in level than the contact parts 11-*a*. Thus, although in FIG. 4A and FIG. 4B, the displacement of the vibrator 2 is shown in exaggerated amounts, the thinner parts 11-*c* and 11-*d* actually do not interfere with the slider 3 even when the contact parts 11-*a* are making elliptic motions. As a result, only the plurality of contact parts 11-*a* that generate a desired feeding force (each of the contact parts 11-*a* generates substantially the same feeding force) can contact the slider 3, whereby the desired feeding force can be applied to the slider 3.

FIG. 5A to FIG. 5G are top plan views showing, by way of example, respective piezoelectric element films S1 to S7 constituting the piezoelectric element plate 12 shown in FIG. 2 having a laminated structure. The piezoelectric element films S1 to S7 may be designed in various configurations such as ones described in Japanese Patent Laid-Open Publication (Kokai) No. 2004-320846, for example.

As shown in FIG. 5A to FIG. 5G, the piezoelectric element plate 12 is prepared as a laminated piezoelectric element by aligning and laminating the seven piezoelectric element films S1 to S7 in this order, and firing the laminated films. The piezoelectric element film S2 has electrode films S2-A, S2-B, and S2-S formed on one surface thereof. The piezoelectric element film S3 has an electrode film S3-G formed on one surface thereof. The piezoelectric element film S4 has electrode films S4-A and S4-B formed on one surface thereof. The piezoelectric element film S5 has, on one surface thereof, an electrode film S5-G. The piezoelectric element film S6 has electrode films S6-A and S6-B formed on one surface thereof. The piezoelectric element film S7 has an electrode film S7-G formed on one surface thereof.

The piezoelectric element film S1 has formed therein four through electrodes S1-HA, S1-HB, S1-HS, and S1-HG. The piezoelectric element film S2 has formed therein three through electrodes S2-HA, S2-HB, and S2-HG. The piezoelectric element film S3 has formed therein three through electrodes S3-HA, S3-HB, and S3-HG. The piezoelectric element film S4 has formed therein three through electrodes S4-HA, S4-HB, and S4-HG. The piezoelectric element film S5 has formed therein three through electrodes S5-HA, S5-HB, and S5-HG. The piezoelectric element film S6 has formed therein one through electrode S6-HG.

The above through electrodes are formed through the respective piezoelectric element films in the thickness direction thereof so as to provide conduction between associated electrode films. The through electrodes of the piezoelectric element film S1 forming a surface layer are exposed to the surface of the piezoelectric element film S1 so that these through electrodes are also used to provide conduction between the piezoelectric element plate 12 and an external circuit.

The through electrode S1-HA provides conduction between itself and the electrode films S2-A, S4-A, and S6-A. The through electrode S1-HB provides conduction between itself and the electrode films S2-B, S4-B, and S6-B. The through electrode S1-HG provides conduction between itself and the electrode films S3-G, S5-G, and S7-G. The through electrode S1-HS provides conduction between itself and the electrode film S2-S.

When the through electrode S1-HG is used as a common potential electrode and an alternating current potential is applied to the through electrode S1-HA, substantially a half of the piezoelectric element plate functions as the activation part 13-A (FIG. 3). When the through electrode S1-HG is used as a common potential electrode and an alternating current potential is applied to the through electrode S1-HB, substantially a half of the piezoelectric element plate functions as the activation part 13-B (FIG. 3). A sensor for monitoring the vibration state of the vibrator 1 is provided by detecting an output potential of the through electrode S1-HS with the through electrode S1-HG as a common potential electrode when the vibrator 1 is in a driven state.

According to the ultrasonic motor 1 of the present embodiment, the surfaces of the contact parts 11-a are flush with the surfaces of the edge parts 11-b, and thus a required component accuracy obtained by machining can be easily secured. Further, the vibrator has no projection and hence the size of the vibrator can be reduced, whereby the power ratio to the size of the ultrasonic motor 1 can be increased.

Also according to the ultrasonic motor 1 of the present embodiment, the vibration plate 11 has substantially the same thickness over the entire range of the contact parts 11-a and the edge parts 11-b. Thus, the vibration plate 2 can be formed by press punching a metal plate material or by an etching process, that is, the method of forming the vibration plate 2 can be selected.

Although the first vibration mode and the second vibration mode have been described as the primary out-of-plane bending mode and the secondary out-of-plane bending mode, respectively, the first vibration mode and the second vibration mode are not limited to them. The first vibration mode and the second vibration mode also may be the primary out-of-plane bending mode and a quaternary out-of-plane bending mode, respectively, or may be the secondary out-of-plane bending mode and a ternary out-of-plane bending mode, respectively. In short, the first vibration mode and the second vibration mode may be any bending vibration modes insofar as a plurality of positions exist at which elliptic motions have substantially the same trajectory in the vicinity of the loops of one bending mode and in the vicinity of the nodes of the other bending mode.

Figure 6:
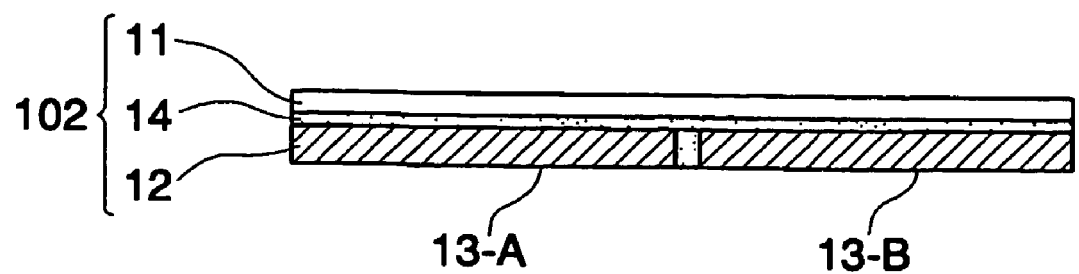
FIG. 6 is a cross-sectional view taken along plane X-Z in FIG. 2, schematically showing the structure of a first variation of the vibrator of FIG. 2.

FIG. 6 is a cross-sectional view taken along plane X-Z in FIG. 2, schematically showing the structure of a first variation of the vibrator of FIG. 2.

The vibrator 102 of FIG. 6 has substantially the same structure as that of the vibrator 2 of FIG. 2. Therefore, the same components as those of FIG. 1 are denoted by the same reference numerals and duplicate description thereof is omitted. Only components different from those of the vibrator 2 of FIG. 2 will be described below. This also applies to further variations described hereinafter.

As shown in FIG. 6, a deactivation part 14 is interposed between the piezoelectric element plate 12 and the vibration plate 11. With the vibration plate 11 and the piezoelectric element plate 12 integrally joined together via the deactivation part 14, the vibration plate 12 and the deactivation part 14 act as in-plane rigidity parts required for the unimorph structure.

The piezoelectric element plate 12 of the first variation is preferably formed of a laminated piezoelectric element. Specifically, the piezoelectric element film S7 of the laminated piezoelectric element shown in FIG. 5 is followed by a piezoelectric element film that has no electrode and acts as the deactivation part 14, thereby providing the structure of the piezoelectric element plate 12 including the deactivation part 14 as shown in FIG. 6.

Figure 7:
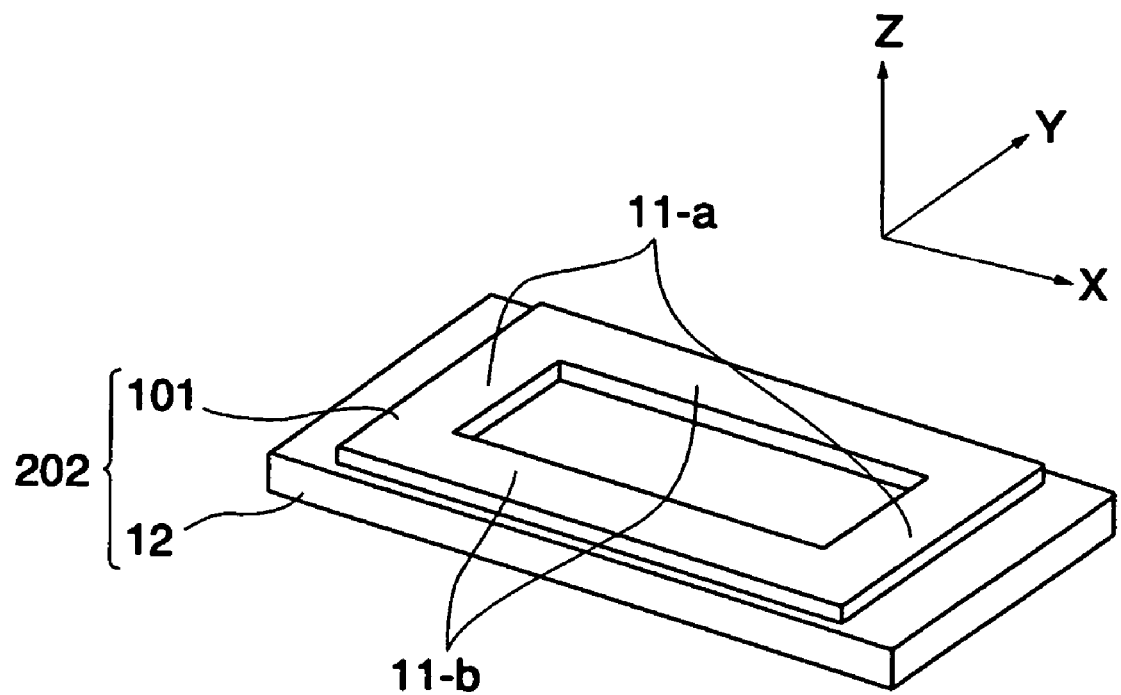
FIG. 7 is a schematic perspective view showing the structure of a second variation of the vibrator of FIG. 2.

FIG. 7 is a schematic perspective view showing the structure of a second variation of the vibrator of FIG. 2.

As in the case of the vibrator 2 of FIG. 2, the vibration plate 101 of the vibrator 202 of FIG. 7 is comprised of contact parts 11-a and edge parts 11-b. The lengths in the directions "X" and "Y" of the vibration plate 101 are shorter than those of the piezoelectric element plate 12.

According to the vibrator 202 of FIG. 7, the vibration plate 11 has a simple shape and thus can be manufactured more easily. Furthermore, the vibration plate 11 has a reduced area of joining to the piezoelectric element plate 12, and thus the amount of vibration energy absorbed by the adhesive can be reduced to improve the efficiency of the ultrasonic motor.

Figure 8:
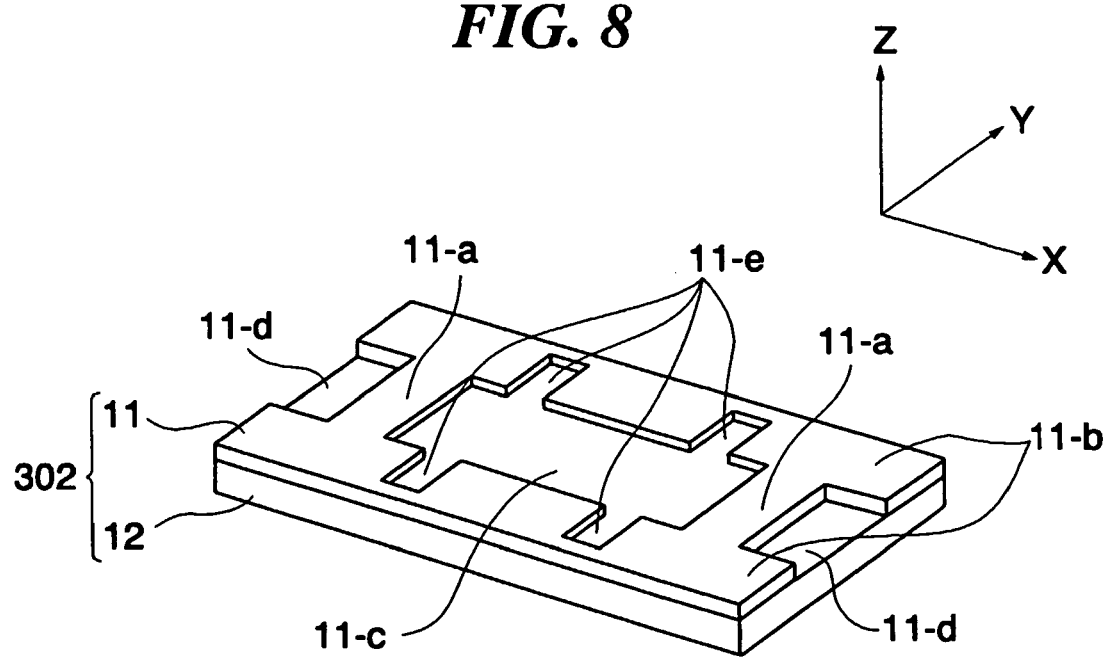
FIG. 8 is a schematic perspective view showing the structure of a third variation of the vibrator of FIG. 2.

FIG. 8 is a schematic perspective view showing the structure of a third variation of the vibrator of FIG. 2.

The vibration plate 11 of the vibrator 302 of FIG. 8 includes four compensation thinner parts 11-e that are provided at opposed longer sides of the thinner part 11-c, two compensation thinner parts 11-e being disposed at each longer side. The compensation thinner parts 11-e each have the same thickness as that of the thinner part 11-c. The compensation thinner parts 11-e are formed from a metal plate material simultaneously with the thinner part 11-c by carrying out an etching process for example so as to remove unnecessary parts from the metal plate material.

The compensation thinner parts 11-e are shaped such that the resonance frequency of the vibrator 11 changes in the same manner in both of the two vibration modes and changes in accordance with the thicknesses of the two thinner parts 11-c and 11-e. In the third variation, the compensation thinner parts 11-e are formed at four positions substantially in the vicinity of the nodes of the second vibration mode so that the resonance frequency changes in the same proportion both in the two vibration modes.

According to the vibrator 302 of FIG. 8, it is possible to adjust a variation in the difference in the resonance frequency of the vibrator 2 in the respective two vibration modes due to a variation in the thicknesses caused during formation of the thinner parts, thereby preventing the vibrator 2 from having degraded vibration characteristics.

Figure 9:
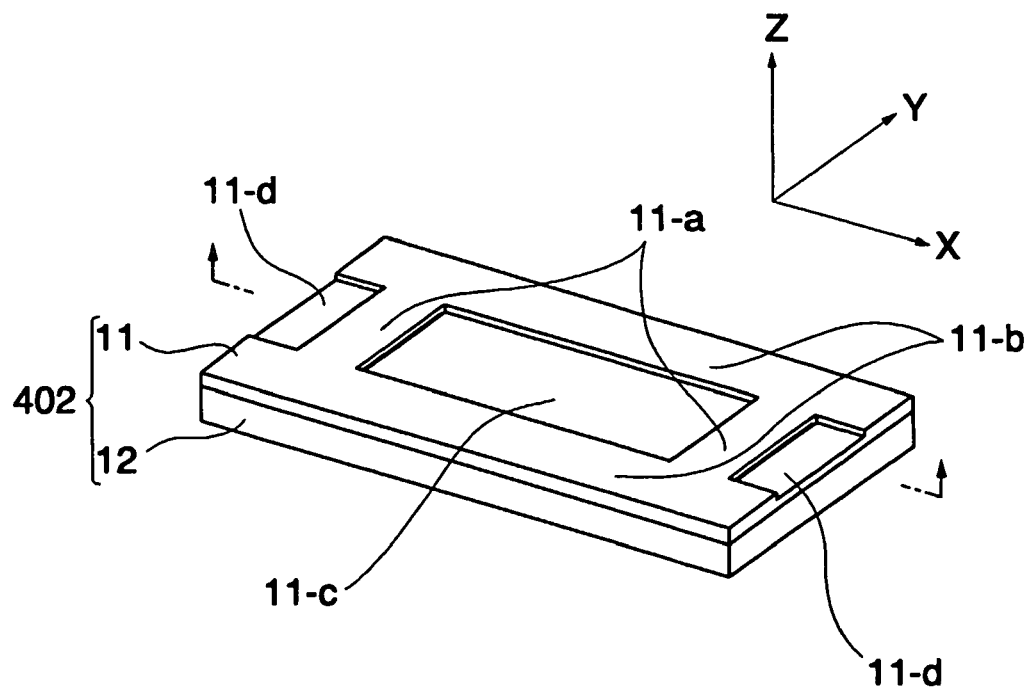
FIG. 9 is a schematic perspective view showing the structure of a fourth variation of the vibrator of FIG. 2.

FIG. 9 is a schematic perspective view showing the structure of a fourth variation of the vibrator of FIG. 2.

Figure 10:
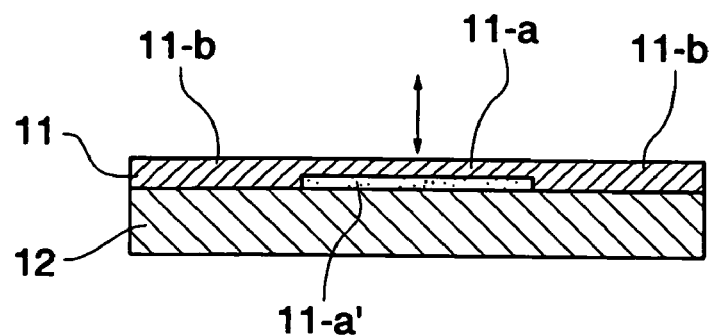
FIG. 10 is a cross-sectional view taken at line X-X in FIG. 9.

In the vibration plate 11 of the vibrator 402 of FIG. 9, the contact parts 11-a each have a recessed part 11-a' (FIG. 10) so as to form a space in a surface of the vibration plate 11 opposed to the piezoelectric element plate 12. As a result, the contact parts 11-a can provide the vibration plate 11 with an elastic characteristic exhibited in the direction "Z" in FIG. 9 so that the contact parts 11-a can contact the slider 3 in a stable manner, thereby enabling efficient transmission of the vibration energy of the vibrator 402 to the slider 3. This elastic characteristic can be set to a desired value by selecting the thickness or size in the direction "X" of the contact parts 11-a.

Figure 11:
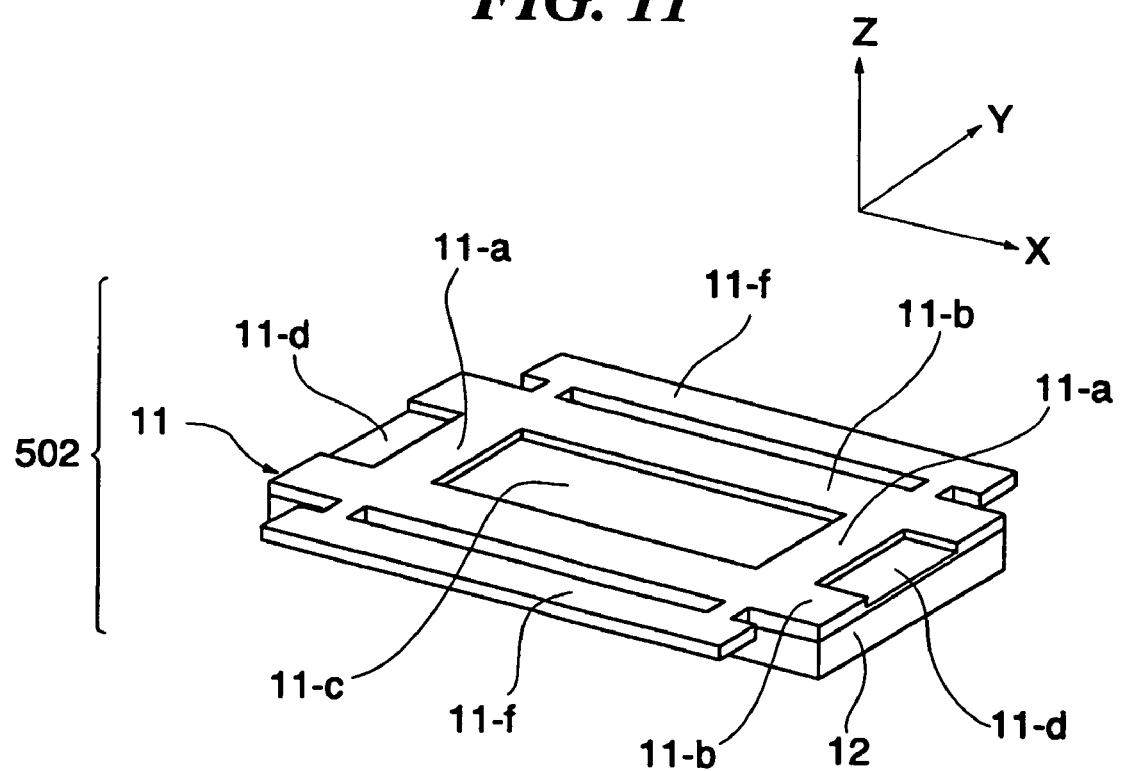
FIG. 11 is a schematic perspective view showing the structure of a fifth variation of the vibrator of FIG. 2.
Figure 12:
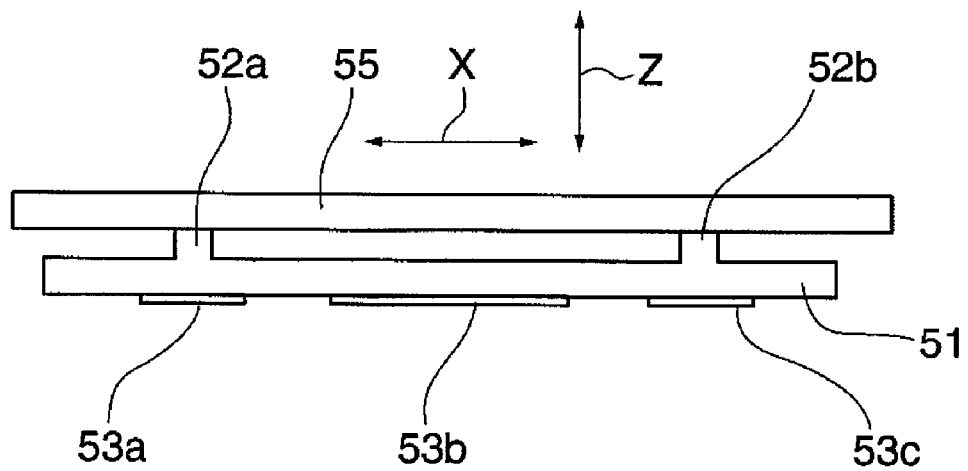
FIG. 12 is a view useful in explaining the structure of a conventional ultrasonic motor.
Figure 13:
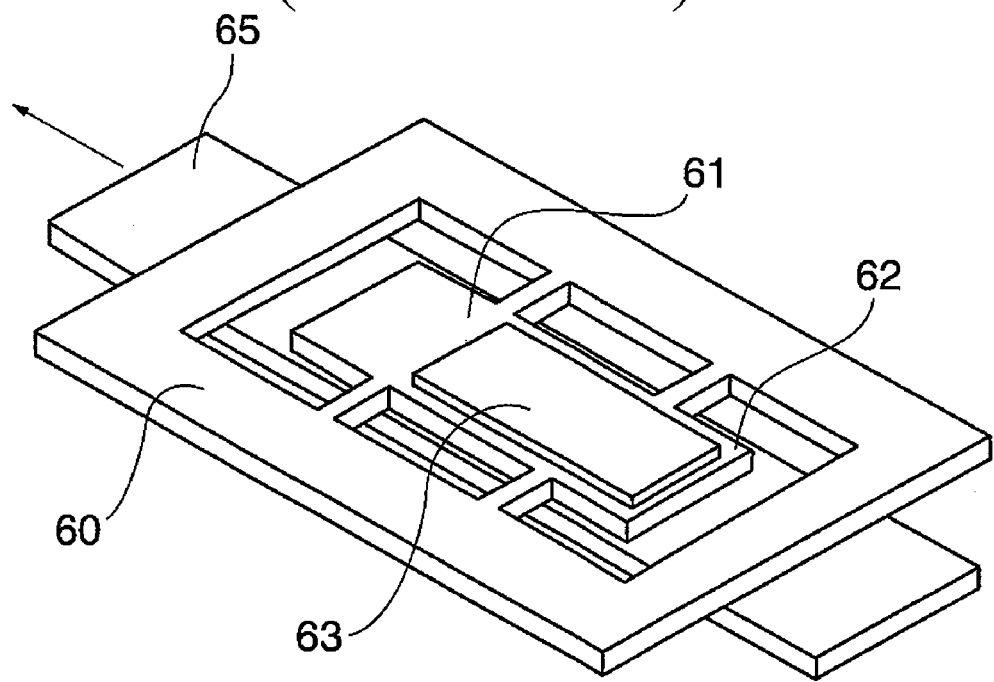
FIG. 13 is a view useful in explaining the structure of another conventional ultrasonic motor.

FIG. 11 is a schematic perspective view showing the structure of a fifth variation of the vibrator of FIG. 2.

The vibration plate 11 of the vibrator 502 of FIG. 11 is formed integrally with a pair of supporting parts 11-f of the vibrator 502 which protrude from the body of the vibration plate 11 in the direction "Y" in FIG. 11.

According to the vibrator 502 of FIG. 11, the supporting parts 11-f are formed integrally with the vibrator 502, thus suppressing dissipation of the vibration energy caused by the state of joint of components and a variation in the vibration characteristics, for example.

The supporting parts 11-f may be formed simultaneously with the vibration plate 11 when the vibration plate 11 is formed by press punching or an etching process, for example. This is suitable for mass production and provides a stable component accuracy, whereby the improved dimensional accuracy of the supporting parts can suppress variations in characteristics caused by a state of support of the vibrator 502.

As many apparently widely different embodiments of the present invention can be made without departing from the spirit and scope thereof, it is to be understood that the invention is not limited to the specific embodiments thereof except as defined in the appended claims.

INDUSTRIAL APPLICABILITY

As described in detail heretofore, according to a vibration wave driven apparatus according to a first aspect of the present invention, at least one of an elastic member, formed of a single member and having one surface formed with a plurality of contact parts disposed in contact with a driven member, and an electromechanical conversion element, joined to the other surface of the elastic member, has a portion thereof opposed to the driven member, and at least one recessed part is formed in the just-mentioned portion at a location other than the contact parts, whereby the elastic member is disposed in contact with the driven member at the contact parts; as a result, it is possible to secure a required component accuracy obtained by machining and increase a power ratio to the size of the apparatus.

According to a vibrator according to a second aspect of the present invention, an elastic member is formed of a single member and has one surface having a plurality of contact parts formed thereon and a recessed part formed thereon between the contact parts, and an electromechanical conversion element is joined to another surface of the elastic member and excites the elastic member in a plurality of out-of-plane bending vibration modes having different wavelength directions; as a result, it is possible to secure a required component accuracy obtained by machining and increase a power ratio to the size of the apparatus.

The invention claimed is:

1. A vibration wave driven apparatus comprising:
a driven member; and
a vibrator comprising:
an elastic member having one surface opposed to said driven member, and another surface, said elastic member having a plurality of spaced contact parts formed on the one surface and disposed in contact with said driven member, said elastic member being formed of a single member; and
an electromechanical conversion element joined to the another surface of said elastic member,
wherein said elastic member has at least one cutout that extends completely through said elastic member to expose part of said electromechanical conversion element at a location where the another surface of said elastic member is joined to said electromechanical conversion element,
wherein portions of said elastic member adjacent to said cutout form the spaced contact parts,
wherein said at least one cutout is opposed to said driven member, and
wherein said elastic member is disposed in contact with said driven member only at said spaced contact parts.

2. A vibration wave driven apparatus according to claim 1, wherein said elastic member has a second portion extending laterally away from said driven member, said second portion being flush with said spaced contact parts.

3. A vibration wave driven apparatus according to claim 1, wherein said elastic member is formed from a metal plate material.

4. A vibration wave driven apparatus according to claim 1, wherein said electromechanical conversion element comprises a laminated piezoelectric element having piezoelectric materials and electrode materials alternately laminated one upon another.

5. A vibration wave driven apparatus according to claim 1, wherein said elastic member includes a plurality of second cutouts at a plurality of locations thereof for adjusting vibration characteristics of the vibrator.

6. A vibration wave driven apparatus according to claim 1, wherein said elastic member has at least one supporting part integrally formed thereon, for supporting the vibrator.

7. A vibration wave driven apparatus according to claim 1, wherein said electromechanical conversion element excites said elastic member in a plurality of out-of-plane bending vibration modes having different wavelength directions.

8. A vibration wave driven apparatus according to claim 7, wherein said plurality of spaced contact parts are formed in a vicinity of loops of one of the bending vibration modes and in a vicinity of nodes of another one of the bending vibration modes.

9. A vibration wave driven apparatus according to claim 1, wherein said driven member and said elastic member form a magnetic circuit.

10. A vibrator comprising:
an elastic member having one surface and another surface, said elastic member having a plurality of spaced contact parts formed on the one surface, said elastic member being formed of a single member; and
an electromechanical conversion element joined to the another surface of said elastic member,
wherein said electromechanical conversion element excites said elastic member in a plurality of out-of-plane bending vibration modes having different wavelength directions, and wherein said elastic member has at least one cutout that extends completely through said elastic member to expose part of said electromechanical conversion element at a location where the another surface of said elastic member is joined to said electromechanical conversion element, wherein portions of said elastic member adjacent to said cutout form the spaced contact parts, wherein said at least one cutout is configured to be opposed to a driven member, and wherein said elastic member is configured to be disposed in contact with the driven member only at said spaced contact parts.

11. A vibrator according to claim 10, wherein said elastic member is formed from a metal plate material.

12. A vibrator according to claim 10, wherein said electromechanical conversion element comprises a laminated piezoelectric element having piezoelectric materials and electrode materials alternately laminated one upon another.

13. A vibrator according to claim 10, wherein said elastic member includes a plurality of second cutouts at a plurality of locations thereof for adjusting vibration characteristics of the vibrator.

14. A vibrator according to claim 10, wherein said elastic member has at least one supporting part integrally formed thereon, for supporting the vibrator.

15. A vibrator according to claim 10, wherein said plurality of spaced contact parts are formed in a vicinity of loops of one of the bending vibration modes and in a vicinity of nodes of another one of the bending vibration modes.

* * * * *